United States Patent
Yashar et al.

(10) Patent No.: US 8,456,185 B2
(45) Date of Patent: Jun. 4, 2013

(54) TEST ADAPTER AND METHOD FOR ACHIEVING OPTICAL ALIGNMENT AND THERMAL COUPLING THEREOF WITH A DEVICE UNDER TEST

(75) Inventors: Frank Yashar, Cupertino, CA (US); David J. K. Meadowcroft, Santa Clara, CA (US); Seng-Kum Chan, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 338 days.

(21) Appl. No.: 12/858,424

(22) Filed: Aug. 17, 2010

(65) Prior Publication Data

US 2012/0043984 A1     Feb. 23, 2012

(51) Int. Cl.
    *G01R 31/20*        (2006.01)
(52) U.S. Cl.
    USPC ............ 324/754.11; 324/754.23; 324/750.23; 324/750.11; 324/750.16; 324/762.01
(58) Field of Classification Search
    USPC ............ 324/754.23, 750.16, 750.03, 750.11, 324/762.01–762.1, 754.11, 750.23; 385/40, 385/88; 356/126, 237.1
See application file for complete search history.

(56) References Cited

U.S. PATENT DOCUMENTS

| | | | |
|---|---|---|---|
| 5,389,873 A * | 2/1995 | Ishii et al. ................ | 324/750.03 |
| 5,412,330 A * | 5/1995 | Ravel et al. .............. | 324/754.23 |
| 5,498,973 A | 3/1996 | Cavaliere et al. | |
| 6,248,604 B1 | 6/2001 | Eng et al. | |
| 6,424,533 B1 * | 7/2002 | Chu et al. ...................... | 361/719 |
| 6,501,260 B1 | 12/2002 | Hu et al. | |
| 6,797,936 B1 | 9/2004 | Kessler et al. | |
| 6,910,812 B2 * | 6/2005 | Pommer et al. ................. | 385/92 |
| 7,042,563 B2 * | 5/2006 | Wilsher et al. ............. | 356/237.1 |
| 7,256,879 B2 | 8/2007 | Hall et al. | |
| 7,298,941 B2 * | 11/2007 | Palen et al. ..................... | 385/33 |
| 2003/0085453 A1 * | 5/2003 | Eyman et al. ................. | 257/678 |
| 2005/0168212 A1 * | 8/2005 | Hunt et al. ................. | 324/158.1 |

\* cited by examiner

*Primary Examiner* — Arleen M Vazquez

(57) ABSTRACT

Independent assemblies are compliantly mounted to a force transfer mechanism to optically align and thermally couple a device under test (DUT) to a test apparatus. A first assembly includes an optical connector. The first assembly has an alignment feature and a first compliant interface. A second assembly includes a thermal control member and force transfer members coupled to a structure. A passage permits a portion of the arm of the first assembly to extend through the structure. The force transfer members provide respective seats for an additional compliant interface. The alignment feature engages a corresponding feature to align the optical connector with the DUT before the compliant interfaces compress under an external force. Compliant mounting of the assemblies accommodates manufacturing tolerances in the DUT so that contact forces on the DUT are relatively consistent and thereby enable consistent optical and thermal coupling between the test apparatus and the DUT.

20 Claims, 8 Drawing Sheets

TEST ADAPTER AND METHOD FOR ACHIEVING OPTICAL ALIGNMENT AND THERMAL COUPLING THEREOF WITH A DEVICE UNDER TEST

BACKGROUND

Electro-optical devices, such as semiconductor lasers, have become important commercial components. They are used in a wide variety of applications including the transfer of data to and from optical storage media, in measurement devices, and as transmitters in optical fiber communication systems.

Semiconductor lasers are manufactured on wafers or substrates. The wafers or substrates are significantly larger than the individual semiconductor lasers. Consequently, bars including one-dimensional arrays or other arrays of multiple semiconductor lasers can be manufactured simultaneously, cleaved or separated from the wafer or substrate and packaged together to produce assemblies with multiple lasers. Due to the manufacturing costs associated with packaging multiple laser assemblies, it is desirable to ensure that each of the semiconductor lasers forming the bar or array within the final assembly are suitable for the desired application. One proven approach to determine suitability is to use a laser bar testing system to characterize operating characteristics of the individual semiconductor lasers forming the bar under test. The bars that do not meet specifications will generally be scrapped before entering into the packaging stage of the manufacturing process. In a conventional laser bar tester, a holder or chuck is removed so that a probe can contact appropriate electrical connections to energize the semiconductor laser under test and to permit an optical sensor to be arranged to intersect the emitted light.

In contrast with conventional bar testers which must accurately apply one or more probes to various electrical contacts and appropriately locate an optical sensor in registration with the optical path of a select laser device on the bar, test solutions for packaged modules or completed assemblies face additional alignment and other environmental issues.

Consider a device under test (DUT) that includes an optical emitter surrounded by a housing. The housing provides for electrical connections (e.g., power and data signal connections) through the base or bottom surface for electrical and physical mounting to a printed circuit board and an optical connection along another surface. The housing of the DUT includes thermally conductive structures for controlling the operating temperature of the optical emitters and any associated electronic circuitry in the package.

To test the device under test across a range of expected operating conditions, it may be desirable to provide accurate temperature control of the DUT while also aligning an optical pickup apparatus with the optical emitter. Manufacturing tolerances and variation of the thermally conductive structures and/or optical emitting surface of the DUT make it problematic to design a test adapter that can controllably and repeatedly align an optical pickup with the optical emitter while also effectively thermally coupling one or both of the thermally conductive structures of the DUT.

SUMMARY

An embodiment of an apparatus for providing independent optical alignment and thermal coupling between the apparatus and a device under test (DUT) comprises a first assembly and a second assembly. The first assembly includes a plate compliantly mounted and arranged to support an optical connector that optically aligns an optical sensor with an optical emitter in the DUT. The second assembly is independent of the first assembly and includes a first thermal control member compliantly mounted and having a first surface arranged to contact a corresponding surface of the DUT.

An embodiment of a method for achieving optical alignment and thermal coupling between a device under test (DUT) and a test adapter includes the steps of introducing a test adapter having independent assemblies, a first assembly having an optical connector and an alignment feature, a second assembly having a thermal control member coupled to opposed force transfer members, providing a first compliant interface between the first assembly and an external force transfer mechanism, providing a second compliant interface between the second assembly and the external force transfer mechanism, introducing a DUT having a respective alignment feature in close proximity to the test adapter, and engaging the external force transfer mechanism to move the test adapter toward the DUT along an axis that is substantially parallel to a longitudinal axis of the alignment feature, the alignment feature of the test adapter engaging a respective feature of the DUT to align a photosensitive device in the optical connector with an optical emitter in the DUT before a force capable of compressing the compliant interfaces is applied by the external force transfer mechanism.

In operation, the compliant interfaces are contacted by an external force in the second direction; and the alignment feature aligns the corresponding optical elements of the apparatus and the DUT before the thermal control member of the second assembly contacts the DUT. When under compression, the independent compliant interfaces allow the apparatus to adjust to manufacturing variations in the DUT.

In an alternative embodiment, the apparatus includes a third assembly that is a substantial duplicate of the second assembly. The force transfer members of the third assembly provide seats for a third compliant interface. In this alternative embodiment, a fourth compliant interface is attached to one or both of adjacent surfaces of the first assembly and the second assembly to control relative movement between the assemblies. In this alternative arrangement, the second assembly contacts a first thermal control surface of the DUT, the third assembly contacts a second control surface of the DUT that is opposed to the first control surface of the DUT and the arm of the first assembly extends through the respective passages formed by the second assembly and the third assembly.

The figures and detailed description that follow are not exhaustive. The disclosed embodiments are illustrated and described to enable one of ordinary skill to make and use the test adapter. Other embodiments, features and advantages will be or will become apparent to those skilled in the art upon examination of the following figures and detailed description. All such additional embodiments, features and advantages are within the scope of the test adapter and method for achieving optical alignment and thermal coupling with a device under test as defined in the accompanying claims.

BRIEF DESCRIPTION OF THE FIGURES

The test adapter and method for achieving optical alignment and thermal coupling with a device under test can be better understood with reference to the following figures. The components within the figures are not necessarily to scale, emphasis instead being placed upon clearly illustrating the principles for achieving optical alignment and thermal coupling between a test adapter and a device under test (DUT). Moreover, in the figures, like reference numerals designate corresponding parts throughout the different views.

DETAILED DESCRIPTION

Figure 1:
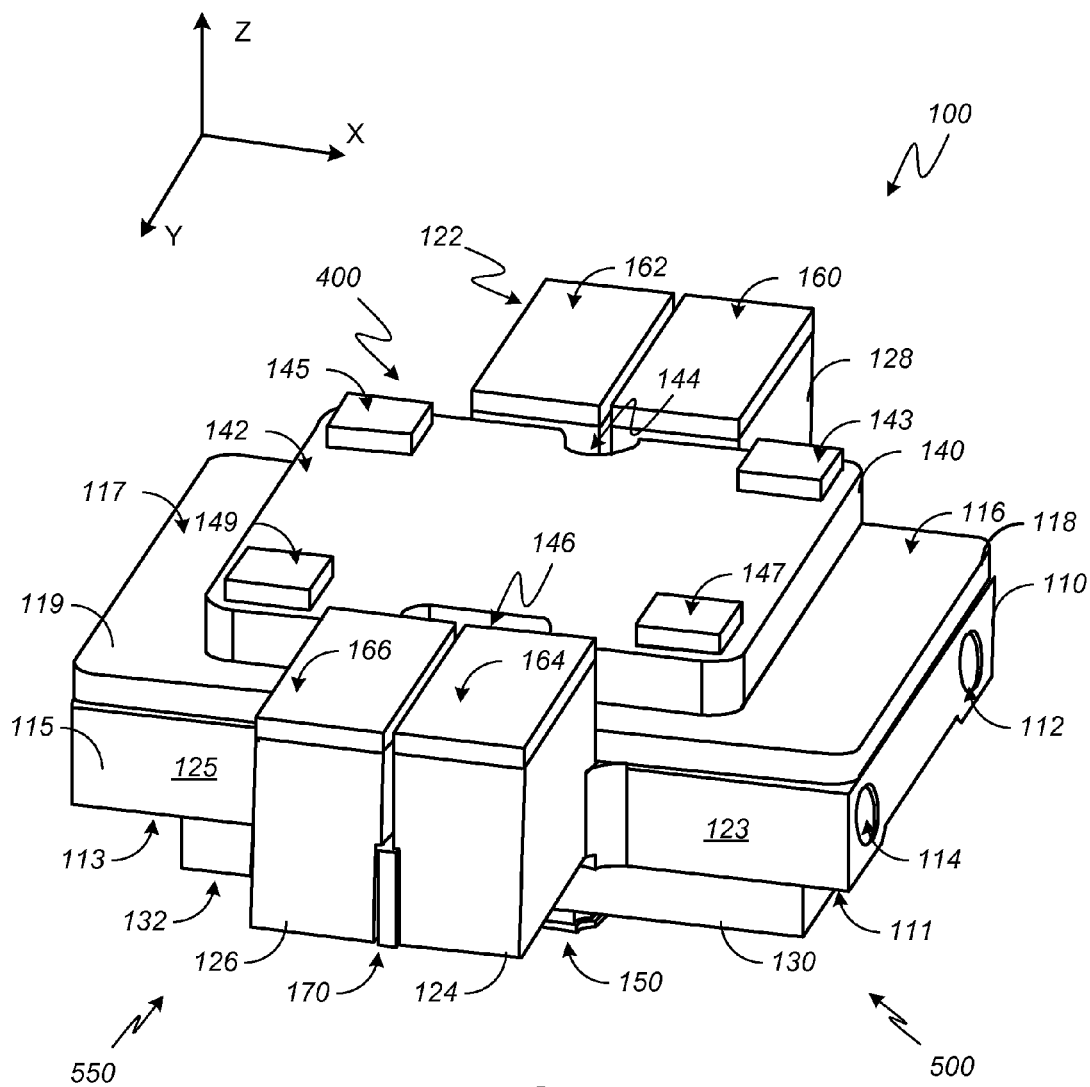
FIG. 1 is a perspective view (top view) of an embodiment of a test adapter.

A test adapter is configured to forcibly contact select surfaces of a device under test (DUT). The DUT is an electro-optical device that includes one or more optical emitters (e.g., semiconductor lasers) surrounded by a housing. The housing includes electrical connections (e.g., power and data signal connections) for electrical coupling and physical mounting to a printed circuit board. The optical emitters are arranged in an optical connector along a surface opposed to the base surface such that emitted light exits the DUT along a beam axis that is substantially orthogonal to the base or bottom surface of the DUT. The housing includes thermally conductive structures located on opposite sides of the optical connector for controlling the operating temperature of the optical emitters.

To thoroughly observe and verify satisfactory operation of the DUT over a range of operating conditions including various temperatures, a test adapter is introduced. The test adapter includes independent assemblies that are compliantly mounted to a force transfer mechanism.

When the force transfer mechanism is enabled, a first assembly optically aligns an optical connector with an emitter in the DUT. The optical alignment occurs as a result of the engagement of one or more alignment features of the first assembly that engage a corresponding alignment feature of the DUT. Alternative alignment features and relationships are contemplated. For example, the DUT can be arranged with an alignment feature that extends beyond other structures of the DUT and the first assembly of the test adapter can be arranged with a corresponding alignment feature arranged to receive or otherwise engage the alignment feature of the DUT. However the alignment features are implemented, the fluid and continuous motion of the alignment features coming together ensure optical alignment of the corresponding optical devices of the test adapter and the DUT before a force capable of compressing the compliant members is applied by the force transferring mechanism.

Thereafter, as result of a fluid and continuous motion in a single direction of a strike plate or other structures connected to the force transfer mechanism, a second assembly contacts a thermally conductive structure of the DUT. The second assembly of the test adapter includes a thermal control member and opposed force transfer members coupled to a structure.

Due to manufacturing tolerances, the contact surface of a thermally conductive structure of a DUT can vary over one or more dimensions. Furthermore, the location of an optical assembly or connector arranged within the DUT can vary over one or more dimensions. In addition, the corresponding contact surfaces of the test adapter can vary over one or more dimensions. Respective compliant interfaces are attached to each of the force transfer members and/or a strike plate or other structure coupled to the force transfer mechanism. Compression of the compliant interfaces in contact with the second assembly provides repeatable and effective thermal control as a result of the relatively constant force between the respective thermal control surfaces of the test adapter and the DUT. The compliant mounting of the second assembly to the strike plate enables the thermal control members of the test adapter to adjust to manufacturing variation in the corresponding features of the DUT by enabling the test adapter to adjust to dimensional variations or angular variations (displacement or tilt, respectively) of the corresponding thermal control surfaces of the DUT.

Figure 2:
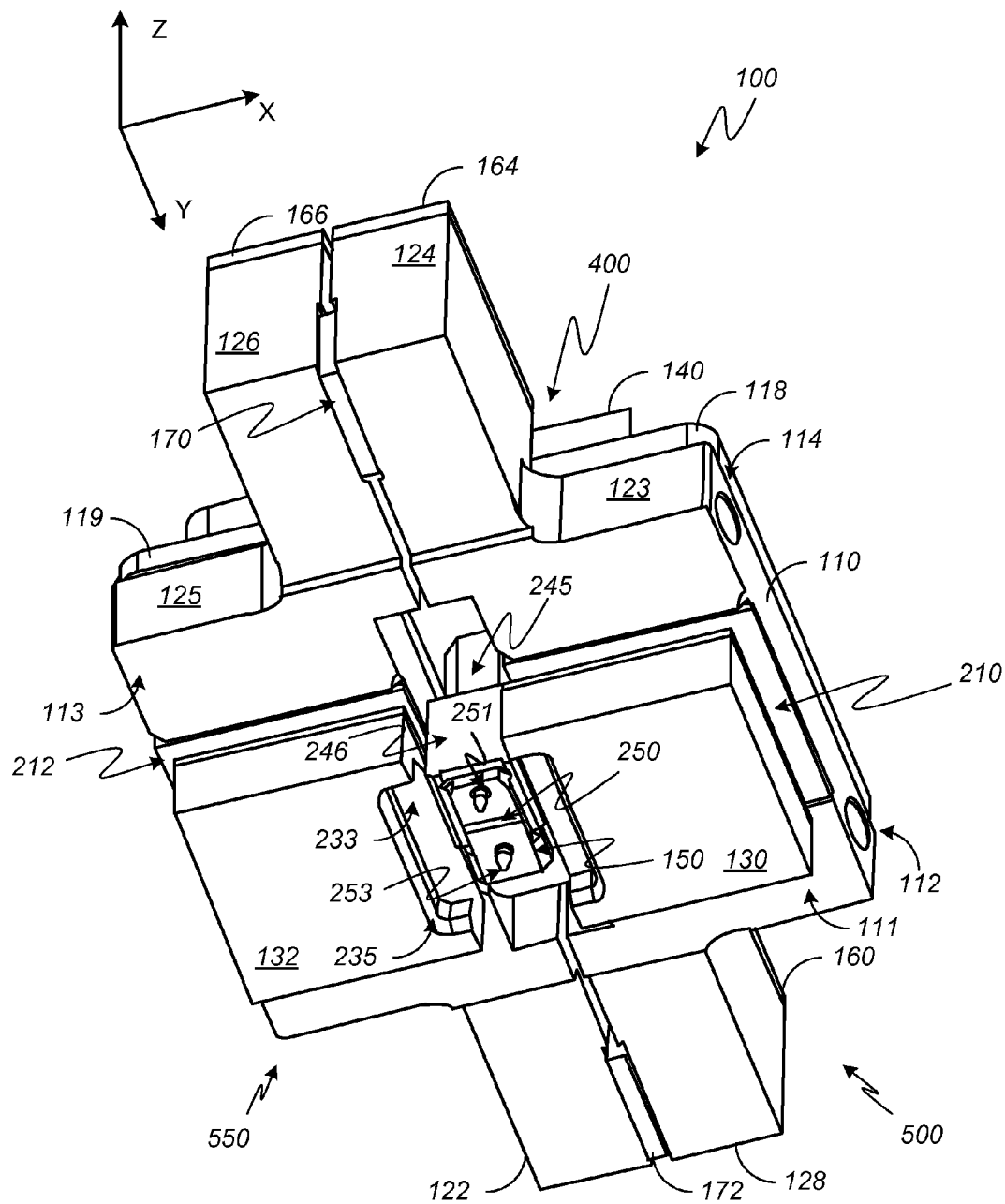
FIG. 2 is an alternative perspective view (bottom view) of the test adapter of FIG. 1.
Figure 3:
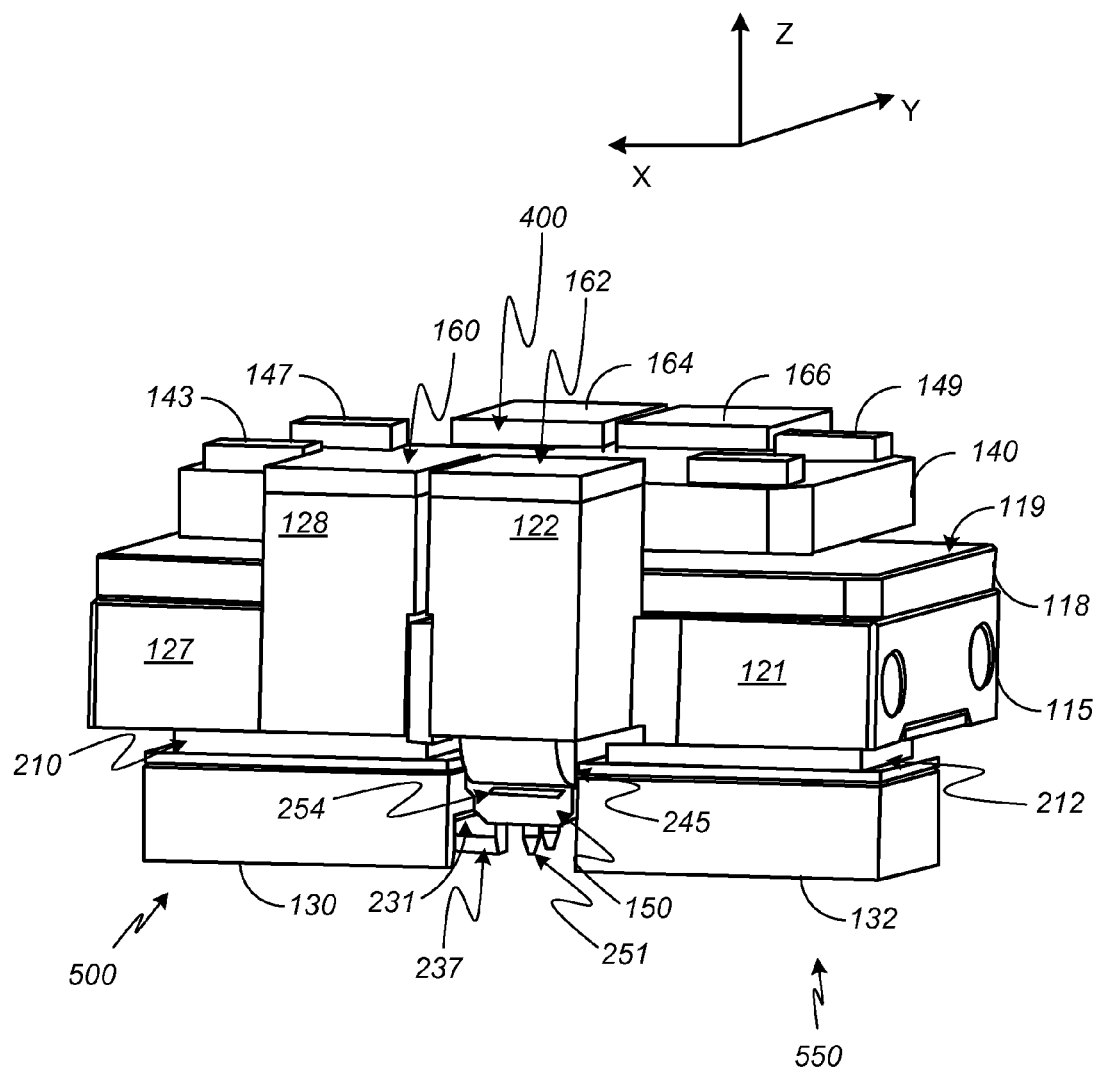
FIG. 3 is a third perspective view (side view) of the test adapter of FIGS. 1 and 2.

Having briefly described the test adapter and its operation, focus is now directed to the example embodiments illustrated in the drawings. FIGS. 1-3 show the various assemblies of the test adapter 100 in close proximity with each other with a strike plate removed to show compliant members attached to corresponding features of the test adapter 100. A first compliant interface is formed by the set of compliant members attached to the first assembly 400. This first set of compliant members is in contact with the mounting surface 142 of the mounting plate 140 and includes compliant member 143, compliant member 145, compliant member 147 and compliant member 149. A second compliant interface is formed by a second set of compliant members attached to the second assembly 500. This second set of compliant members is in contact with corresponding surfaces of the force transfer member 124 and the force transfer member 128 and includes compliant member 164 and compliant member 160. A third compliant interface is formed by a set of compliant members attached to the third assembly 550. This third set of compliant members is in contact with corresponding surfaces of the force transfer member 126 and the force transfer member 122 and includes compliant member 166 and compliant member 162. A fourth compliant interface is formed by a set of compliant members attached to one or both of adjacent surfaces of the second assembly 500 and the third assembly 550. The nature and operation of the compliant members will be explained further below.

Figure 4A:
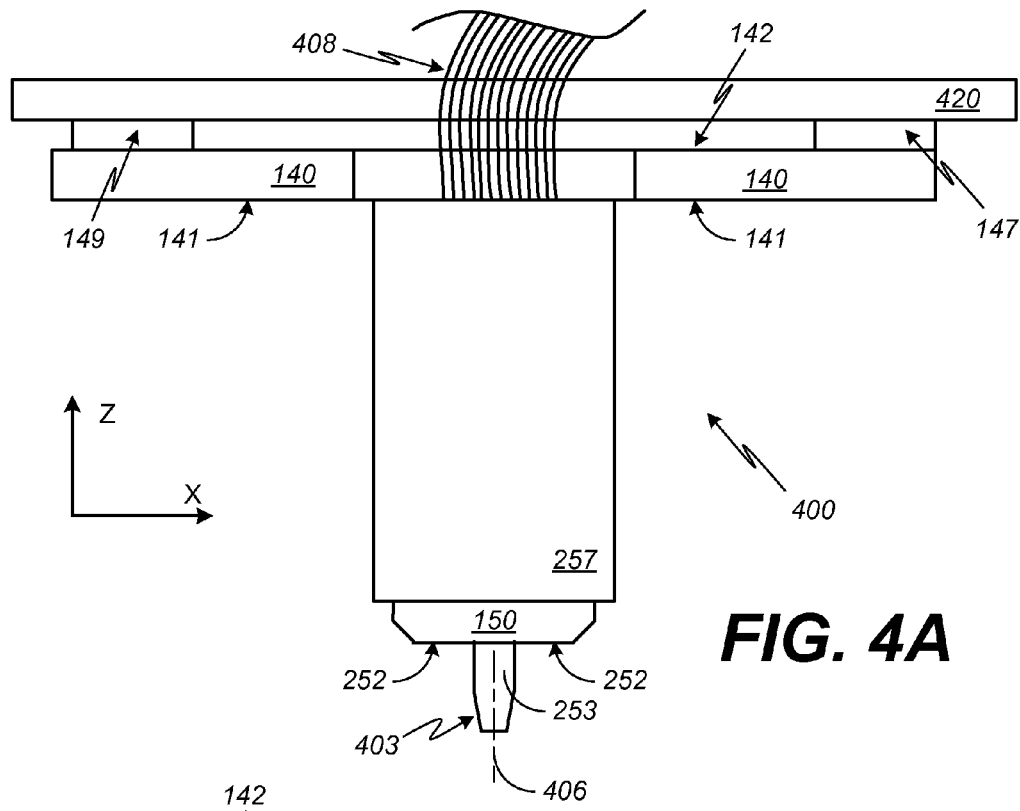
FIGS. 4A and 4B are schematic side views of a first assembly of the test adapter of FIGS. 1-3 in contact with an external strike plate.
Figure 4B:
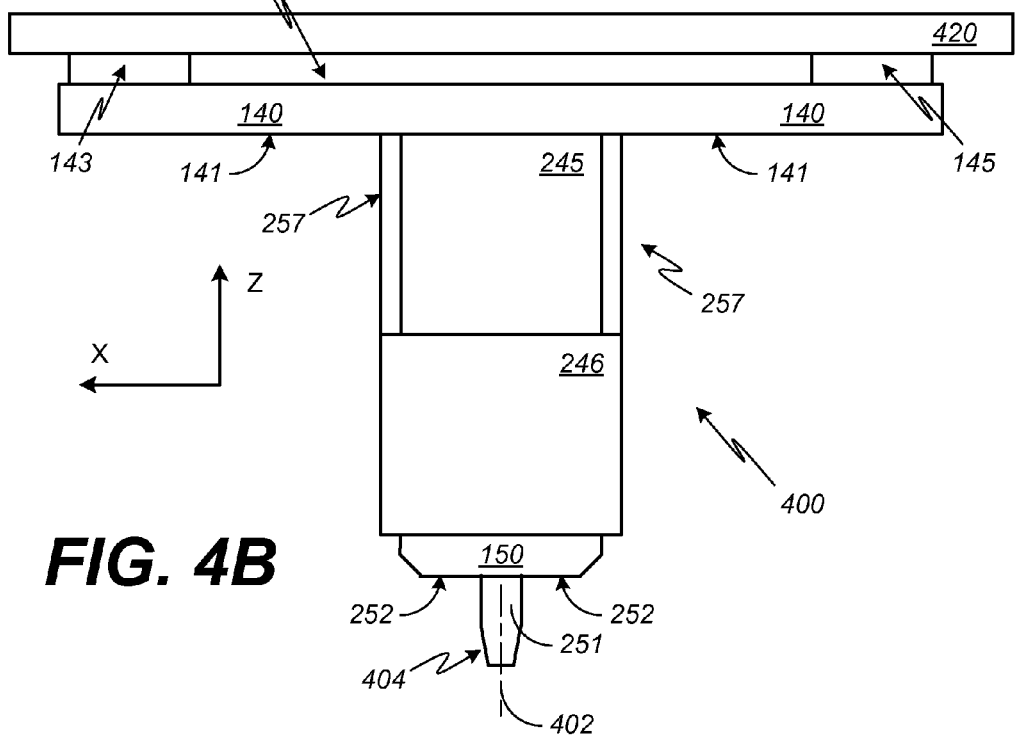
Figure 4C:
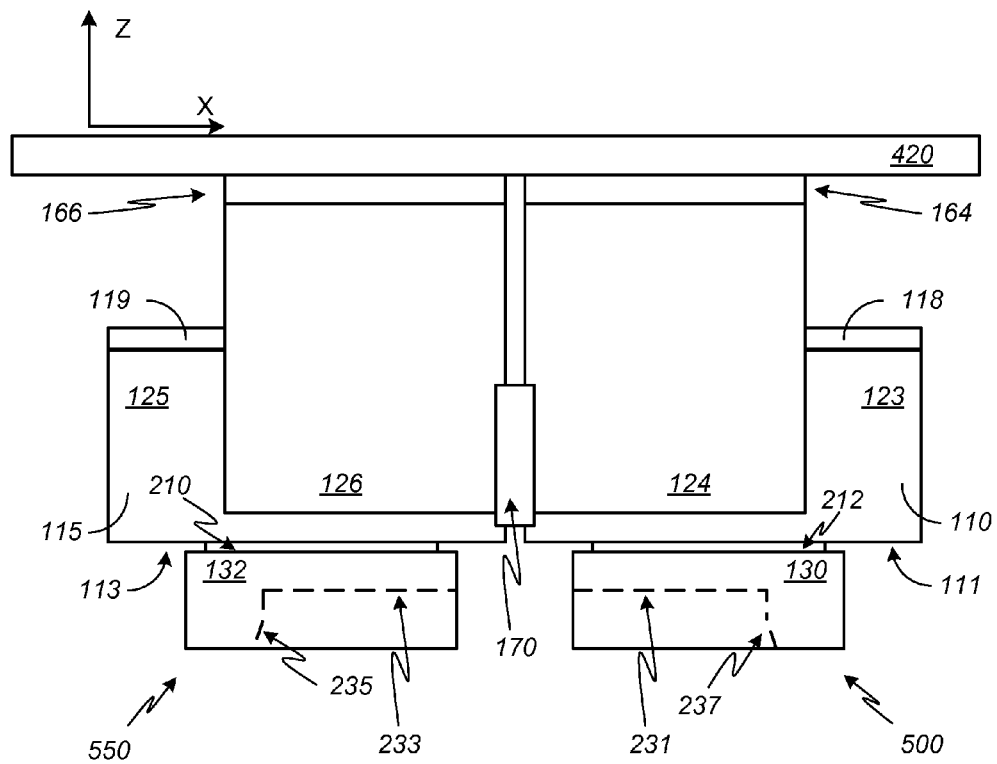
FIGS. 4C and 4D are schematic side views of second and third assemblies of the test adapter of FIGS. 1-3 in contact with an external strike plate.
Figure 4D:
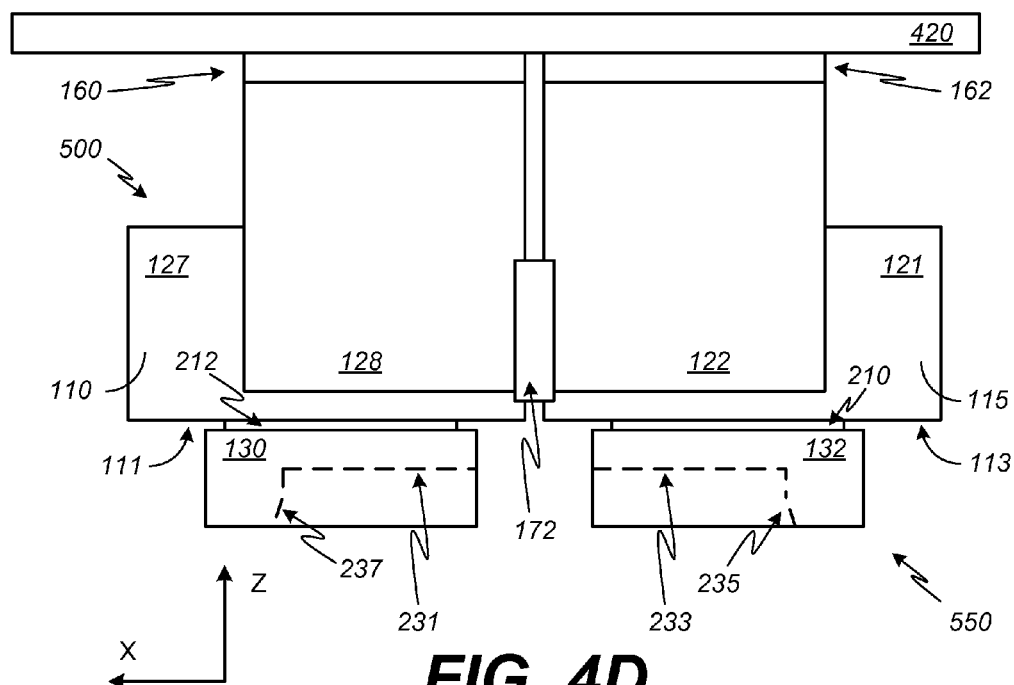

The first assembly 400 is illustrated in FIGS. 4A and 4B. The first assembly 400 is in contact with strike plate 420 in front and rear elevations in FIG. 4A and FIG. 4B, respectively. The strike plate 420 is also in contact with the second assembly 500 and the third assembly 550 as illustrated in FIG. 4C and FIG. 4D.

Referring to FIG. 4A, the first assembly 400 includes a mounting plate 140 with a first surface 141 and an opposed mounting surface 142. Visible in FIG. 4A is a cover 257 that extends from the optical connector head 150 along the entire length of an arm (hidden in FIG. 4A) that supports the cover 257 and the optical connector head 150. The cover 257 forms a channel and protects a flexible parallel fiber ribbon 408 that optically couples the optical connector head 150 to test equipment remote from the test adapter 100. Also visible in FIG. 4A is an alignment feature 253. The alignment feature 253 extends beyond other features of the first assembly 400 along the Z axis. A longitudinal axis 406 of the alignment feature 253 is substantially orthogonal to the first surface 141 and the mounting surface 142 of the mounting plate 140 and is substantially parallel to the longitudinal axis 402 of the alignment feature 251 (FIG. 4B). The alignment feature 253 is a pin that includes a tapered surface 403 at the distal end of the pin. In FIG. 4A, a compliant member 147 is arranged at the right-most side of the mounting plate 140 and a compliant member 149 is arranged at the left-most side of the mounting plate 140.

FIG. 4B includes an opposing view of the first assembly 400 from that shown in FIG. 4A. An arm 245 extends substantially orthogonally from the first surface 141 in the negative Z direction. A carriage 246, at the distal end of the arm 245, holds the optical connector head 150. An alignment feature 251 extends approximately the same distance as the alignment feature 253 with both alignment features 251, 253 extending beyond other features of the first assembly 400 in the Z direction. A longitudinal axis 402 of the alignment feature 251 is substantially orthogonal to the first surface 141 and the mounting surface 142 of the mounting plate 140. The alignment feature 251 is a pin that has a tapered surface 404 at its distal end. The optical connector head 150 includes a surface 252 with one or more photosensitive devices (not shown) or reflective features that couple the light to the parallel fiber ribbon 408 (FIG. 4A).

As described briefly above, the strike plate 420 contacts one or more compliant members forming the first, second, and third compliant interfaces to apply a force that is substantially parallel to the longitudinal axis 402 of the alignment feature 251 and to the longitudinal axis 406 of the alignment feature 253. In the illustrated embodiment, a separate compliant member is located near each of four corners on the mounting surface 142 of the mounting plate 140. In FIG. 4B, a compliant member 145 is arranged at the right-most side of the mounting plate 140 and a compliant member 143 is arranged at the left-most side of the mounting plate 140.

FIGS. 4C and 4D are schematic front and rear views that show features of the second assembly 500 and the third assembly 550 of the test adapter 100 of FIGS. 1-3 in contact with the strike plate 420 via respective compliant interfaces between the strike plate 420 and force transfer members 124, 128 of the second assembly 500 and force transfer members 122, 126 of the third assembly 550. The second assembly 500 includes a structure 110 having a wall 123 that rigidly supports the force transfer member 124. The structure 110 further includes a thermal control surface 111 that supports a thermal control element 212 (e.g., a thermoelectric device) between the structure 110 and the thermal control member 130. A lid 118 encloses one or more chambers within the structure 110. The one or more chambers or reservoirs can include a fluid for transferring heat energy to and or from the second assembly 500. The chambers or reservoirs can receive a temperature controlled fluid from a test control system coupled to the structure 110 (connections not shown) to control operating conditions in a DUT thermally coupled to the test adapter via contact with the thermal control member 130.

The thermal control member 130 is made of a thermally-conductive metal and includes a contact surface 231 in an optional recess. The contact surface 231 is shaped to engage a correspondingly shaped surface of a thermally conductive structure of the DUT. The contact surface 231 is substantially centered under the second compliant interface formed by the compliant member 164 and the compliant member 160. As shown in FIG. 4C and FIG. 4D, the optional recess can be further defined by a tapered or sloped surface 237. Optionally, a compliant, thermally conductive pad (not shown in FIG. 4C, 4D) can be placed on surface 231 to further improve the thermal coupling between thermal contact member 130 and the thermally conductive structure of the DUT.

The compliant member 164 is shown between a lowermost surface of the strike plate 420 and an uppermost surface or seat of the force transfer member 124. As explained above, the compliant member 164 is attached to the strike plate 420 and to the seat of the force transfer member 124. The compliant member 170 located between adjacent surfaces of the force transfer member 124 and a force transfer member 126 from the independent third assembly 550 is a member of the set of compliant members that form the fourth compliant interface. The fourth compliant interface provides proper distance control between assemblies 500 and 550 and counteracts imbalances that result from the fact that the center of gravity of assembly 500 and the center of gravity of assembly 550 are not centered under the second compliant interface (which includes the compliant member 160 and the compliant member 164) for assembly 500 and the third compliant interface (which includes the compliant member 162 and the compliant member 166) for assembly 550. The compliant member 164 and the compliant member 170 can be formed or cut from sheets of silicone rubber or similar compliant materials. There is no requirement that these compliant materials have similar densities and thicknesses for adjusting relative movement between the assembly 500 and the assembly 550. However, compliant members 160, 162, 164, 166, 143, 145, 147, and 149 should have similar densities and thicknesses or the calculations of the forces being applied by the first assembly, second assembly, and third assembly to the DUT become much more difficult to determine.

The third assembly 550 includes a structure 115 having a wall 125 that rigidly supports a force transfer member 126 and a thermal control surface 113 that supports a thermal control element 210 (e.g., a thermoelectric device) between the structure 115 and the thermal control member 132. A lid 119 encloses one or more chambers within the structure 115. The one or more chambers or reservoirs can include a fluid for transferring heat energy to and or from the third assembly 550. The chambers or reservoirs can receive a temperature controlled fluid from a test control system coupled to the structure 115 (connections not shown) to control operating conditions in a DUT thermally coupled to the test adapter by way of contact with the thermal control member 132.

The thermal control member 132 is made of a thermally-conductive metal and includes a contact surface 233 in an optional recess. The contact surface 233 is shaped to engage a correspondingly shaped surface of a thermally conductive structure of the DUT. The contact surface 233 is substantially centered under the third compliant interface which includes compliant member 162 and compliant member 166. As shown in FIG. 4C and FIG. 4D, the optional recess can be further defined by a tapered or sloped surface 235.

The compliant member 166 is shown between a lowermost surface of the strike plate 420 and an uppermost surface or seat of the force transfer member 126. As explained above, the compliant member 166 is attached to both of the strike plate 420 and the seat of the force transfer member 126.

FIG. 4D reveals the reverse side of the second assembly 500 and the third assembly 550. The second assembly 500 further includes a wall 127 of the structure 110 that rigidly supports a force transfer member 128 that opposes the force transfer member 124. A compliant member 160 is shown between a lowermost surface of the strike plate 420 and an uppermost surface or seat of the force transfer member 128. As explained above, the compliant member 160 is attached to both the strike plate 420 and the seat of the force transfer member 128. An additional compliant member 172 is located between adjacent surfaces of the force transfer member 128 and a force transfer member 122 from the independent third assembly 550. The compliant member 172 is a member of the set of compliant members that form the fourth compliant interface.

The reverse side of third assembly 550 includes a wall 121 of the structure 115 that rigidly supports a force transfer member 122 that opposes the force transfer member 126. A compliant member 162 is shown between a lowermost surface of the strike plate 420 and an uppermost surface or seat of the force transfer member 122. As explained above, the compliant member 162 is attached to both the strike plate 420 and the seat of the force transfer member 122.

Reference is made to FIG. 1, which includes a perspective view of an embodiment of an apparatus or test adapter 100. Specifically, the perspective is that of an observer that is just above a front-side of the test adapter 100. In the illustrated embodiment, the test adapter 100 includes a first assembly 400 (shown in greater detail in FIGS. 4A and 4B), a second assembly 500 and a third assembly 550 in close proximity with one another. The first assembly 400, the second assembly 500 and the third assembly 550 are independently and compliantly mounted to the strike plate 420 (not shown in FIGS. 1-3) and possibly additional structures (not shown) by way of the strike plate 420. The mounting plate 140 of the first assembly 400 is located above the uppermost surface 117 of the lid 119 and the uppermost surface 116 of the lid 118. The arm 245 (hidden from view in FIG. 1) of the first assembly 400 extends through a recess or passage formed by the structure 110 and the thermal control member 130 of the second assembly 500 and the structure 115 and the thermal control member 132 of the third assembly 550. The thermal control member 130 is connected to the structure 100 by way of the thermal control element 212 and the thermal control surface 111. Similarly, the thermal control member 132 is connected to the structure 115 by way of the thermal control element 210 and the thermal control surface 113. As explained above, the thermal control member 130 and the thermal control member 132 include respective contact surfaces shaped to engage correspondingly shaped surfaces of separate thermally conductive structures of the DUT.

The structure 110 and the structure 115 are arranged to form separate reservoirs that are enclosed by the lid 118 and the lid 119, respectively to enclose the reservoirs or chambers. An ingress port 112 and an egress port 114 are visible on the rightmost side of the structure 110. When the ingress port 112 and the egress port 114 are coupled to appropriately sized fixtures or tubing, the coupled reservoir or chamber can receive temperature controlled fluid from a test control system via the ingress port 112 and return the fluid to the same via the egress port 114. The structure 115 is similarly configured.

The mounting plate 140 bridges a passage (hidden from observation in FIG. 1) that is formed by the structure 110 and the structure 115. An optical connector head 150, which is supported by an arm 245 that extends below the mounting plate 140, is observable below the thermal control member 130. The arm 245 and additional features of the first assembly 400 are hidden from observation in FIG. 1 but are observable in FIG. 2, FIG. 4A and in FIG. 4B. The mounting plate 140 includes a first recess or slot 144 and a second recess or slot 146. The first recess or slot 144 allows one or more conductors from a test system (not shown) to be routed into the passage of the test adapter 100. The one or more conductors may provide electrical grounding of the mounting plate 140 and arm 245 across the compliant members 143, 145, 147, and 149 since the compliant material is generally not electrically conductive. The second recess of slot 146 allows a flexible multiple-fiber or multiple-conductor cable 408 (FIG. 4A) to be routed into the passage to couple optical signals from the optical connector head 150 to the test system (not shown). A mounting or uppermost surface 142 of the mounting plate 140 provides a seat or support for the compliant members 143, 145, 147, and 149. The one or more compliant members may be formed from a layer of compliant material. In the illustrated embodiment, compliant member 143 and compliant member 147, are attached near respective corners on the right-hand side of the mounting plate 140 and compliant member 145 and compliant member 149, are attached near respective corners on the left-hand side of the mounting plate 140. The compliant members 143, 145, 147, and 149 are cut or otherwise shaped from a larger sheet of the compliant material, which may comprise a compound of silicone rubber. The compliant material has a thickness and density which make it suitable for repeated compression and decompression in the presence of a normal or compressive force applied in a negative Z direction by way of the strike plate 420 or other structures coupled to an external force transfer mechanism.

Preferably, the compliant member 160, the compliant member 162, the compliant member 164 and the compliant member 166 are formed from the same sheet of material to provide a consistent thickness and density across the respective seats or contact surfaces of force transfer members 122, 124, 126, and 128. Similarly, the compliant member 143, the compliant member 145, the compliant member 147 and the compliant member 149 are formed from the same sheet of material to provide a consistent thickness and density near the four corners of the mounting plate 140. It is also recommended that the compliant members 160, 162, 164 and 166 and the compliant members 143, 145, 147 and 149 also be made from the same sheet of compliant material, but this is not strictly a requirement. If these compliant members are made from the same sheet of material, one can easily calculate that portion of the total force provided by the strike plate 420 on the first assembly 400, second assembly 500, and third assembly 550 as a function of the area of the compliant material used for each of these assemblies.

As illustrated in FIG. 1, an additional compliant member 170 is attached or placed in the gap formed by the adjacent and opposing surfaces of the force transfer member 124 and the force transfer member 126. A corresponding compliant member 172 (hidden from view in FIG. 1) is attached or placed in the gap formed by the adjacent and opposing surfaces of the force transfer member 122 and the force transfer member 128. The compliant members 170 and 172 can be formed from the same sheet of material to provide a consistent thickness and density for compression in the presence of a normal force in the Z axis and manufacturing variation in the contact surfaces of the test adapter 100 and the DUT across both the X axis and the Y axis. This sheet of compliant material may be the same or have a different thickness and density as the sheet of material used to cut or form compliant members 143, 145, 147, 149, 160, 162, 164, and 166.

The arrangement of the separate and independent force transfer members 122, 124, 126 and 128 along opposed walls of the structure 110 and the structure 115 make it possible for one or more force transfer mechanisms to drive the strike plate 420 (shown in FIGS. 4A-4D) against the compliant members 143, 145, 147 and 149 and the compliant members 160, 162, 164 and 166 on the respective force transfer members 122, 124, 126 and 128. Application of a normal force on the respective upper surfaces of the compliant members 143, 145, 147 and 149 enable the mounting plate 140 to independently align the optical connector head 150 with an emitter or emitters arranged in the DUT. Moreover, continued application of the normal force with translation of the test adapter 100 and compression of the compliant members 160, 162, 164 and 166 on the respective force transfer members 122, 124, 126 and 128 enable thermal coupling between corresponding features of the test adapter 100 and the DUT in the presence of manufacturing variation manifested in one or more of the respective contact surfaces of the test adapter 100 and the DUT. Accordingly, the separate and independent compliant members 143, 145, 147, and 149 (i.e. the first compliant interface) on the mounting plate 140 of the first assembly 400 and the separate and independent compliant members 160, 164 (i.e., the second compliant interface) on the force transfer members 128, 124 of the second assembly 500 and the separate and independent compliant members 162, 166 (i.e., the third compliant interface) on the force transfer members 122, 126 of the third assembly 550, as well as, the fourth compliant interface make it possible for the test adapter 100 to be both optically aligned with and thermally coupled to corresponding elements of the DUT in the presence of manufacturing variation in the Z axis or for tilt across the corresponding contact surfaces of the test adapter 100 and the DUT.

FIG. 2 is an alternative view of the test adapter 100 of FIG. 1. The alternative view reveals elements and features observable from the perspective of an observer located below the front-side of the test adapter 100. An arm 245 extends substantially orthogonally from a bottom surface of the mounting plate 140. A carriage 246 connected to the distal end of the arm 245 holds the optical connector head 150 such that it is substantially coplanar with the major surfaces of the mounting plate 140. The optical connector head 150 may includes a sensor array 250 arranged across the optical connector head 150 substantially parallel to the X axis or alternatively, it may include reflective surfaces in the region of array 250 that will couple the light from the DUT to the fiber ribbon 408 (not shown in FIGS. 1-3).

In an alternative embodiment, suitable for when the DUT includes a single emitter, the optical connector head 150 may be arranged with a single photosensitive device or single reflective surface for reflecting the light into a single fiber optic line instead of the fiber ribbon 408.

A first alignment pin 251 extends from the optical connector head 150 in a direction that is substantially parallel to the Z axis as shown in FIG. 2. A second alignment pin 253, separated in distance along the Y axis, also extends from the optical connector head 150 along the Z axis. As illustrated in FIG. 2, the first alignment pin 251 and the second alignment pin 253 are tapered at respective distal ends.

As further illustrated in FIG. 2, the thermal control member 132 and the thermal control member 130 are identical to the other and arranged across the passage formed by the structure 110 of the second assembly 500 and the structure 115 of the third assembly 550. As previously described, the thermal control member 132 and the thermal control member 130 are made from a thermally conductive material such as copper and include respective contact surfaces arranged to thermally couple the test adapter 100 to the DUT. The contact surface 233 is formed in an optional recess of the thermal control member 132 and is shaped to engage a corresponding surface of a thermally conductive structure of the DUT (not shown). The contact surface 233 is planar and substantially parallel with the thermal control surface 113 of the structure 115. Similarly, the contact surface 231 is formed in an optional recess of the thermal control member 130 and is shaped to engage a corresponding surface of a thermally conductive structure of the DUT (not shown). The contact surface 231 is planar and substantially parallel with the thermal control surface 111 of the structure 110.

A right-side thermoelectric device 210 is located in a recess of the thermal control surface 111 of the structure 110 and is in contact with an upper or mounting surface of the thermal control member 130. Similarly, a left-side thermoelectric device 212 is located in a recess of the thermal control surface 113 of the structure 115 and is in contact with an upper or mounting surface of the thermal control member 132. The right-side thermoelectric device 210 and the left-side thermoelectric device 212 transfer heat from a first major surface to an opposed major surface in the presence of a voltage difference applied between electrical leads coupled to corresponding junctions of the respective device. Devices 210 and 212 allow the test adapter to both heat the DUT and cool the DUT so that the DUT can be tested at a range of temperatures.

FIG. 3 is a third perspective view of an embodiment of the test adapter 100 of FIGS. 1 and 2. Specifically, FIG. 3 reveals elements and features observable from a back side of the test adapter 100. As revealed in FIG. 3, the optical connector head 150 includes an optical fiber ribbon port 254 for connecting a multiple-fiber ribbon cable 408 (FIG. 4A) to the optical connector head 150. The multiple-fiber ribbon cable 408 can be routed in the passage and through the recess or slot 146 (FIG. 1) in the mounting plate 140 on its way to a test system.

The contact surface 231 is formed in an optional recess of the thermal control member 130 and is shaped to engage a corresponding surface of a thermally conductive structure of the DUT (not shown). The contact surface 231 is planar and substantially parallel with the thermal control surface 111 of the structure 110.

Figure 4E:
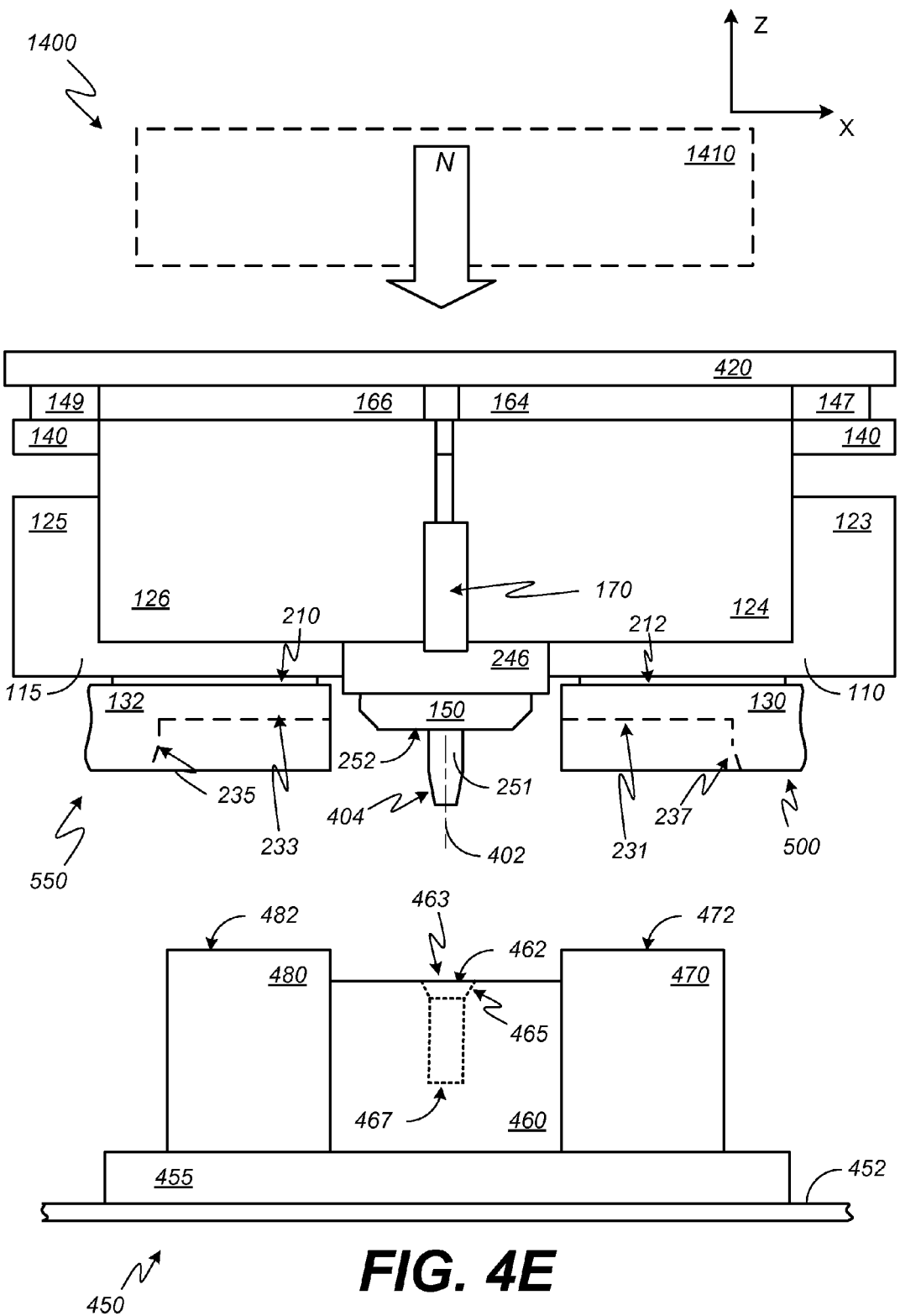
FIG. 4E is a schematic side view of the assemblies of FIGS. 4A-4D in close proximity to a DUT and a force transport mechanism.

FIG. 4E is a schematic side view of the assemblies of FIGS. 4A-4D in close proximity to a DUT 450 and an external force transfer mechanism 1410. As shown in FIG. 4E, a transport assembly 1400 includes the external force transfer mechanism 1410, which applies a normal force against the strike plate 420. In turn, the strike plate 420 and the compliant members 147, 149, 164, and 166 will apply a normal force of up to a desired upper limit to the corresponding contact surfaces of the test adapter 100 and thereafter the DUT 450 once the test adapter 100 and DUT 450 are in contact with one another. The external force transfer mechanism 1410 can be any of a number of mechanical devices or electro-mechanical systems capable of applying a consistent and controllable normal force to the strike plate 420. As the strike plate 420 compresses the compliant members above the force transfer member 126 and the force transfer member 122, the normal force is transferred via the structure 115 and the thermal control member 132 across the surface 233. Similarly, as the strike plate 420 compresses the compliant members above the force transfer member 124 and the force transfer member 128, the normal force is transferred via the structure 110 and the thermal control member 130 across the surface 231. Each of the second assembly 500 and the third assembly 550 moves independently of the other and independently of the first assembly 400 to accommodate manufacturing tolerances in the contact surfaces of the DUT 450.

A base module 455 of the DUT 450 rests on a rigid surface 452. The base module 455 contains multiple conductors arranged to apply power and to control an array of optical emitters (not shown) that are arranged in an array from the left side of the optical connector 460 to the right side of the optical connector 460. As previously described, the array of optical emitters emits light along the Z axis from the surface 462 of the optical connector 460. A right-side structure 470 is made from a thermally conductive material (e.g., aluminum or copper). A planar contact surface 472 is shaped to engage the contact surface 231 of the thermal control member 130. Similarly, a left-side structure 480 is made from a thermally conductive material. A planar contact surface 482 is shaped to engage the contact surface 233 of the thermal control member 132. The left-side structure 480 and the right-side structure 470 provide a medium for the transfer of heat energy into or out from the DUT 450.

As previously described, the strike plate 420, which is substantially rigid in the presence of the normal force, contacts the external surfaces of the compliant members 160, 162, 164 and 166 that are attached to the strike plate 420, as well as the compliant members 143, 145, 147 and 149, which are further attached to the strike plate 420. In turn, the alignment pin 251, which extends beyond the optical connector head 150 and beyond the surface 231 and the surface 233, is arranged in registration with an alignment feature 463 in an optical connector 460 of the DUT 450. (The alignment pin 253 also extends beyond the optical connector head 150 and beyond the surface 231 and the surface 233 and is arranged to engage a second alignment feature in the optical connector 460 of the DUT 450.) A longitudinal axis 402 of the pin 251 is substantially aligned with the alignment feature 463 such that when the normal force is applied to the strike plate 420 along the Z axis, the tapered surface 404 of the alignment pin 251 is received within the confines of a tapered surface 465 in the alignment feature 463. Once the respective tapered surfaces of the alignment pin 251 and the alignment feature 463 contact one another, further motion of the test adapter 100 along the Z axis aligns the photosensitive device(s) or reflective elements on the surface 252 with the one or more emitters arranged along the surface 462, and thereafter, aligns the contact surface 233 with the contact surface 482, and the contact surface 231 with the contact surface 472.

Figure 5:
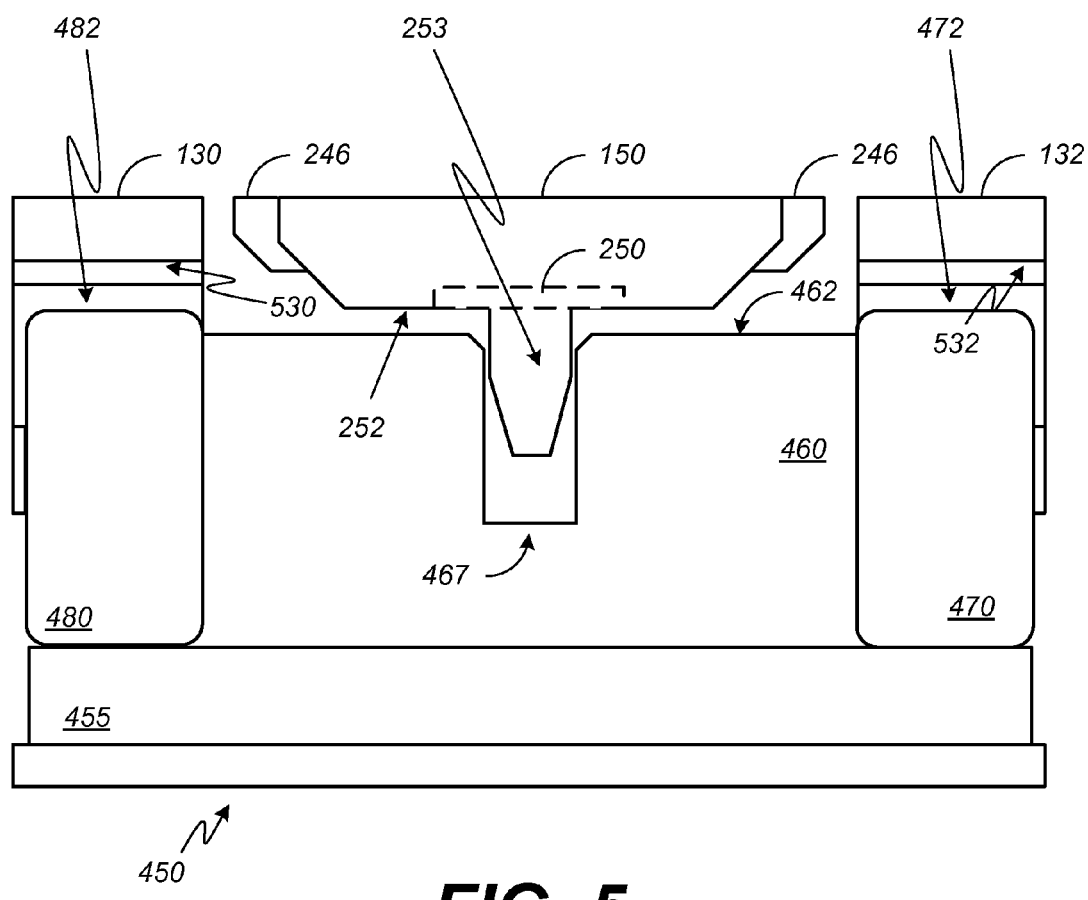
FIG. 5 is a cross-sectional side view of the test adapter of FIGS. 1-3 partially engaged in a DUT.

FIG. 5 includes a partial cross-sectional side view of the test adapter 100 partially engaged with the DUT 450. As shown in FIG. 5, the optical connector 150 includes a sensor array 250 arranged across the surface 252. The sensor array 250 is optically aligned with an array of emitters located internal to or below optical connector 460. As explained above, the sensor array 250 can include a desired number of photosensitive semiconductor devices arranged in a one-dimensional or two-dimensional array. As further shown in FIG. 5, the thermal control member 130 is arranged with an optional thermal pad 530 that under an external force (from above the test adapter 100) will contact the contact surface 482 of the structure 480 of the DUT 450. The thermal control member 132 is arranged with an optional thermal pad 532 that under the external force will contact the contact surface 472 of the structure 470 of the DUT 450. The pin 253 does not contact the lowermost surface of the alignment feature 467. Stated another way, the alignment feature 467 is deeper than the pin 253 is long. Consequently, when the test adapter 100 is fully engaged with the DUT 450, the contact surface 462 of the DUT 450 is in direct contact with the surface 252 of the optical connector 150 of the test adapter 100.

Figure 6:
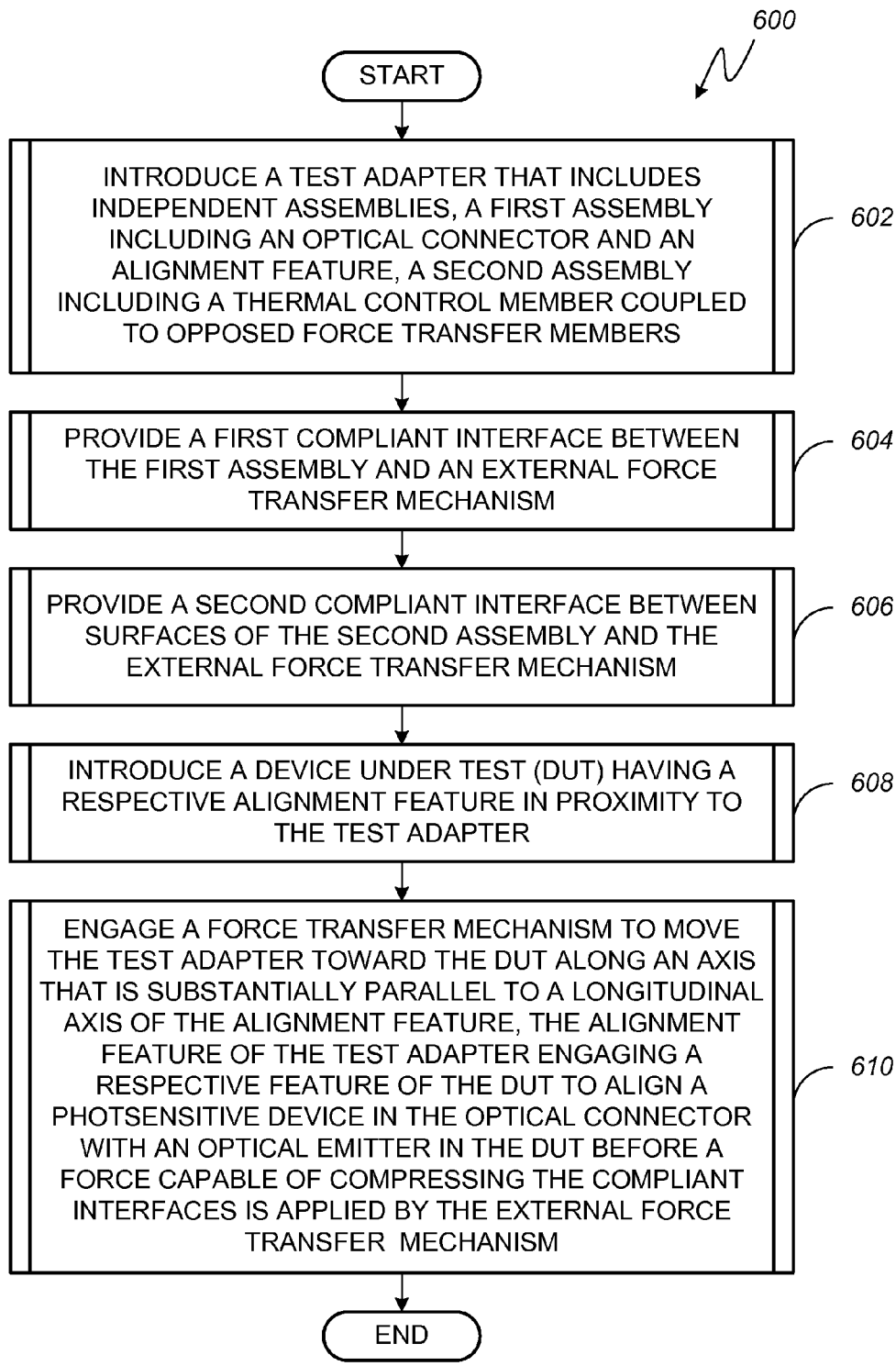
FIG. 6 is a flow chart illustrating an embodiment of a method for achieving optical alignment and thermal coupling between the test adapter and a DUT.

FIG. 6 is a flow chart illustrating an embodiment of a method 600 for achieving optical alignment and thermal coupling between the test adapter 100 and the DUT 450. The method 600 begins with block 602 where an apparatus such as the test adapter 100 is fabricated and introduced. The test adapter 100 includes first and second independent assemblies. The first assembly 400 includes an optical connector (e.g., the optical connector head 150) and alignment features 251 and 253. The second assembly 500 includes a thermal control member 130 coupled to opposed force transfer members 124, 128. The opposed force transfer members 124, 128 are connected to each other on opposing walls of the structure 110.

The method continues with block 604 where a compliant interface is provided between the first assembly 400 and an external force transfer mechanism 1410. As described above, the compliant interface may be formed from a layer of silicone rubber or other compliant material that is attached to one or both of a seat on the first assembly 400 and a strike plate 420. A layer of compliant material is applied with a contact adhesive or an epoxy to the uppermost surface of the mounting plate 140. In the illustrated embodiment, four separate compliant members 143, 145, 147, and 149 are located near the corners of the mounting plate 140. The compliant members 143, 145, 147, and 149 are fixed to the mounting surface 142 of the mounting plate 140 with a contact adhesive or an epoxy.

As indicated in block 606, a second compliant interface which includes compliant member 164 and compliant member 160 is provided between surfaces of the second assembly 500 and the external force transfer mechanism 1410. The compliant members 164, 160 of the second compliant interface may be formed by a layer of compliant material that is applied with a contact adhesive or an epoxy to the uppermost surface or seat of the force transfer member 124 and the uppermost surface or seat of the force transfer member 128. Respective compliant members 162 and 166 are similarly applied with a contact adhesive or an epoxy to the uppermost surfaces of the force transfer member 122 and the force transfer member 126. The contact adhesive or epoxy fixes the respective compliant member to the corresponding force transfer member.

The compliant members applied to the mounting plate 140 (i.e., the first compliant interface) and to the uppermost surfaces of the force transfer elements 122, 124, 126 and 128 (i.e., the second and third compliant interfaces) can be cut or otherwise shaped from one or more sheets of silicone rubber having a desired thickness and density that can withstand repeated compression and decompression. The separate compliant members can be applied in any desired sequence. In alternative embodiments, a strip or other shapes of compliant material can replace the compliant member 143 and the compliant member 147 on the mounting plate 140. Similarly, a strip or other shapes of compliant material can replace the compliant member 145 and the compliant member 147 on the mounting plate 140.

After the functions indicated in blocks 602 through 606 have been performed, and as shown in block 608, a DUT 450 having a respective alignment feature (e.g., the recess 463) is introduced in close proximity to the test adapter 100. The DUT 450 and the test adapter 100 are not engaged or otherwise in contact with each other. However, as described above, the test adapter 100 and the DUT 450 are arranged such that respective major surfaces are nearly parallel to one another with the alignment pin 251 and the alignment pin 253 of the test adapter 100 nearly directly above corresponding recesses in the optical connector 460 of the DUT 450.

After the functions indicated in blocks 602 through 608 have been performed, and as shown in block 610, an external force transfer mechanism 1410 is engaged to contact and move the strike plate 420 along an axis that is substantially parallel to the longitudinal axis 482 of the alignment pin 251 to align the alignment pin 251 with a respective alignment feature 463 of the DUT 450. These features align a photosensitive device in the optical connector head 150 of the test adapter 100 with an optical emitter in the DUT 450 before a force capable of compressing the compliant interfaces is applied by the external force transfer mechanism 1410.

Optical alignment is enabled by providing an alignment feature 251 that extends beyond the contact surface 231 of the thermal control member 130 or the optical connector head 150. The alignment feature 251 engages an alignment feature 463 arranged along the DUT 450. In the illustrated embodiments, the alignment feature associated with the test adapter 100 is a tapered pin 251 that extends from an external surface of the optical connector head 150. The alignment feature 463 associated with the DUT 450 is a recess that has a diameter that is larger than the diameter of pin 251. The alignment feature 463 has a chamfer 465 along the top to encourage initial alignment of the pin 251 as the pin first enters the alignment feature 463. The diameter of the alignment feature 463 below the chamfer 465 is only slightly larger than the diameter of the pin 251. Consequently, the tapered pin 251 promotes repeatable alignment of the optical device(s) in the optical sensor head 150 and the DUT 450 as the test adapter 100 and DUT 450 are brought closer to one another by movement of the strike plate 420.

As previously described, contact with the DUT 450 results in compression of the compliant interfaces which distribute the normal force across the respective contact surfaces of the test adapter 100 and the DUT 450 to ensure both optical alignment and thermal coupling.

Test adapter movement along a single axis not only simplifies the design and control requirements for an associated test system but results in greater reliability, repeatability and control. Consequently, the present test adapter 100, which engages the DUT 450 after translation along a single axis, enables greater throughput than prior art test assemblies that employ multiple axes of motion to arrange sensors, or thermal control members.

The generally parallel arrangement of the contact surface 231 of the thermal control member 130 or members of the test adapter 100 with respect to the corresponding contact surface 472 of the thermally conductive structure 470 of the DUT 450 results in an efficient thermal coupling of the test adapter 100 to the DUT 450. Compliant mounting of the thermal control member 130 enables the associated contact surface 231 thereof to contact the corresponding contact surface 472 of the DUT 450 with a relatively constant force across the surfaces even in the presence of manufacturing variation across the surfaces. This is possible because any relatively small differences introduced by manufacturing variation are countered by compression of the compliant interfaces.

While various example embodiments of the test adapter 100 and method 600 for achieving optical alignment and thermal coupling between the test adapter 100 and the DUT 450 have been illustrated described, it will be apparent to those skilled in the art that many more embodiments and implementations are possible that are within the scope of this disclosure. For example, only one of the alignment pin 251 or the corresponding recess 463 may be tapered to facilitate engagement of these aligning elements. As also described above, the arrangement of the compliant interfaces applied on the mounting surface 142 of the mounting plate 140 can be adjusted by replacing the right-side and left-side compliant interfaces with corresponding strips or other shapes of compliant material. Moreover, the length and width of the compliant members fixed to the mounting plate 140 and/or the upper external surfaces or seats of the force transfer members 122, 124, 126 and 128 can be adjusted as may be desired. Accordingly, the described test adapter 100 and method 600 for achieving optical alignment and thermal coupling between the test adapter 100 and the DUT 450 are not to be restricted or otherwise limited except in light of the attached claims and their equivalents.

What is claimed is:

1. An apparatus for providing independent optical alignment and thermal coupling between the apparatus and a device under test (DUT), the apparatus comprising:
   a first assembly comprising:
      a plate compliantly mounted and arranged to support an optical connector on an arm extending from the plate; and
      a first alignment feature arranged to align the optical connector to the device under test; and
   a second assembly independent from the first assembly, the second assembly comprising:
      a first thermal control member compliantly mounted and having a first surface arranged to contact a corresponding surface of the DUT, the first thermal control member forming a recess for receiving the arm extending from the plate.

2. The apparatus of claim 1, wherein the first assembly has a first compliant interface and the second assembly has a second compliant interface.

3. The apparatus of claim 2, wherein when the first compliant interface and the second compliant interface are contacted by an external force, the first alignment feature aligns the DUT with the optical connector before the thermal control member of the second assembly contacts the DUT.

4. The apparatus of claim 1, further comprising:
   a third assembly independent from the first and second assemblies, the third assembly comprising:
      a second thermal control member compliantly mounted and having a second surface arranged to contact a corresponding surface of the DUT.

5. The apparatus of claim 4, wherein the third assembly has a third compliant interface.

6. The apparatus of claim 4, wherein the first assembly, the second assembly, and the third assembly accommodate variation across respective corresponding features of the DUT.

7. The apparatus of claim 6, further comprising:
   a fourth compliant interface between the second assembly and the third assembly to control the relative positions of the second assembly and the third assembly.

8. The apparatus of claim 7, wherein one of the compliant interfaces comprises rubber.

9. The apparatus of claim 8, wherein the compliant interfaces are formed from a sheet of a material such that each compliant interface has a substantially similar density and thickness.

10. The apparatus of claim 5, wherein the first compliant interface, the second compliant interface, and the third compliant interface, are attached to a strike plate.

11. The apparatus of claim 5, wherein the second assembly and the third assembly have independent heat transfer elements.

12. The apparatus of claim 11, wherein the independent heat transfer elements comprise active heat transfer elements.

13. The apparatus of claim 1, wherein the first alignment feature is a pin.

14. The apparatus of claim 13, wherein the pin has a tapered distal end.

15. The apparatus of claim 1, wherein the optical connector is attached to the plate by an arm and by a carriage.

16. The apparatus of claim 1, wherein the optical connector comprises an array of sensors.

17. A method for achieving optical alignment and thermal coupling between a device under test (DUT) and a test adapter, the method comprising:
   introducing a test adapter that includes independent assemblies, a first assembly including a plate compliantly mounted and arranged to support on an arm extending from the plate an optical connector and an alignment feature, a second assembly including a thermal control member coupled to opposed force transfer members, the thermal control member forming a recess for receiving the arm extending from the plate;

providing a first compliant interface between the first assembly and an external force transfer mechanism;

providing a second compliant interface between the second assembly and the external force transfer mechanism;

introducing a DUT having a respective alignment feature in close proximity to the test adapter; and engaging the external force transfer mechanism to move the test adapter toward the DUT along an axis that is substantially parallel to a longitudinal axis of the alignment feature, the alignment feature of the test adapter engaging a respective feature of the DUT to align a photosensitive device in the optical connector with an optical emitter in the DUT before a force capable of compressing the compliant interfaces is applied by the external force transfer mechanism.

18. The method of claim 17, wherein engaging the external force transfer mechanism results in a fluid and continuous motion to align the test adapter and DUT until the engaging results in compression of the compliant interfaces and application of a distributed contact force via the compliantly mounted assemblies to the DUT.

19. The method of claim 17, wherein providing the first compliant interface, and providing the second compliant interface includes applying a layer of rubber to the respective assemblies.

20. The method of claim 17, wherein introducing a test adapter comprises introducing more than one thermal control assembly.

* * * * *